(12) United States Patent (10) Patent No.: US 7,673,195 B2
Chuang et al. (45) Date of Patent: Mar. 2, 2010

(54) CIRCUITS AND METHODS FOR CHARACTERIZING DEVICE VARIATION IN ELECTRONIC MEMORY CIRCUITS

(75) Inventors: Ching-Te K. Chuang, South Salem, NY (US); Jae-Joon Kim, Austin, TX (US); Saibal Mukhopadhyay, Atlanta, GA (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 11/866,502

(22) Filed: Oct. 3, 2007

(65) Prior Publication Data

US 2009/0091346 A1 Apr. 9, 2009

(51) Int. Cl.
*G11C 29/00* (2006.01)
*G11C 7/06* (2006.01)
(52) U.S. Cl. ............... 714/721; 365/189.07; 365/200
(58) Field of Classification Search .................... None
See application file for complete search history.

(56) References Cited

U.S. PATENT DOCUMENTS 5,687,178 A * 11/1997 Herr et al. .................. 714/721
5,905,387 A * 5/1999 Chinosi et al. ............... 327/62
6,373,738 B1 * 4/2002 Towler et al. ............... 365/49.1
7,133,302 B1 * 11/2006 Srinivasan et al. .......... 365/49.1

* cited by examiner

*Primary Examiner*—Christine T Tu
(74) *Attorney, Agent, or Firm*—Ryan, Mason & Lewis, LLP

(57) ABSTRACT

A circuit includes a comparator circuit configured such that its output toggles from a first digital logical level to a second digital logical level when its first and second inputs transition between a first state wherein the first input has an applied voltage greater than an applied voltage at the second input and a second state wherein the first input has an applied voltage less than an applied voltage at the second input. A plurality of cells each have at least one series-connected pair of field effect transistors interconnected at an output node intermediate the field effect transistors. Decoding logic is configured to select a given one of the cells for measurement, and selectively interconnect the output node of the given one of the cells to the first input of the comparator circuit. Voltage supply circuitry is configured to (i) apply voltages to the gates of the pair of transistors of the given one of the cells selected for measurement, such that the pair of transistors operate in a linear region, and have a variable voltage difference, $\Delta$, between their gate-to-source voltages, and (ii) vary the $\Delta$ until the comparator circuit output toggles from the first digital logical level to the second digital logical level.

16 Claims, 15 Drawing Sheets

PMOS AND NMOS

PMOS AND PMOS

NMOS AND NMOS

Δ DISTRIBUTION FOR IDENTICAL DEVICES IN A DIE

Δ DISTRIBUTION FOR NON-IDENTICAL DEVICES (DEV 1 AND 2) IN DIE 'k'

$\mu_\Delta^{(k)}$ DISTRIBUTION FOR A LARGE NUMBER OF DIES

PMOSs WITH +ve Vgs => LEAKAGE THROUGH UNSELECTED CELLS IS ≈ 0

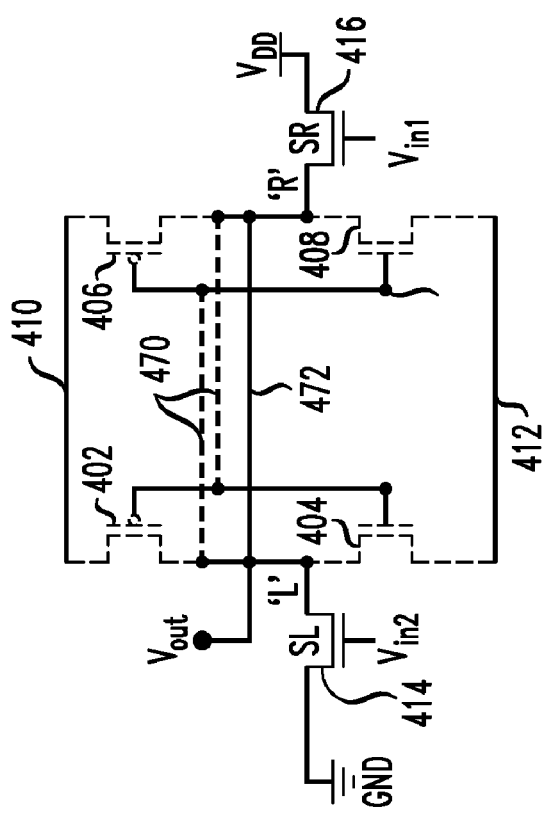
*FIG. 14*
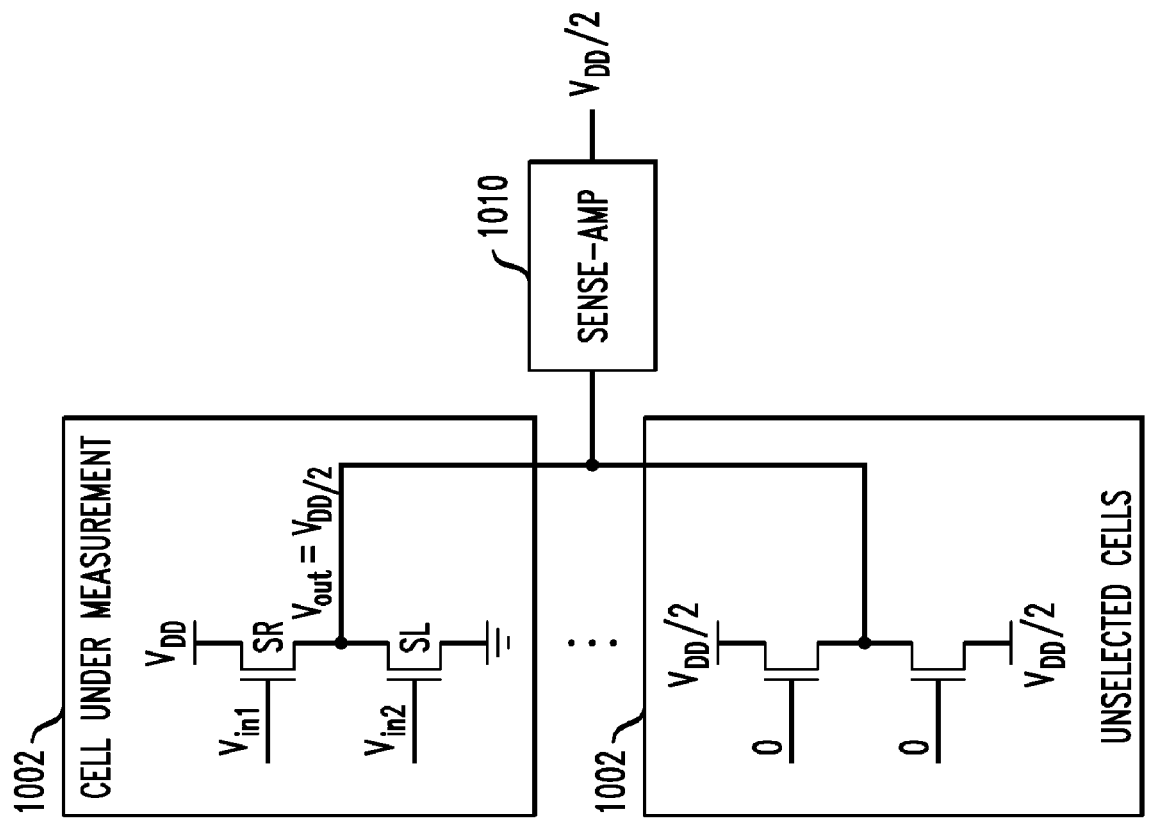

PMOS WITH +ve Vgs AND
NMOSs WITH −ve Vgs ⇒ LEAKAGE
THROUGH UNSELECTED CELLS IS ∼ 0

CIRCUITS AND METHODS FOR CHARACTERIZING DEVICE VARIATION IN ELECTRONIC MEMORY CIRCUITS

STATEMENT REGARDING FEDERALLY SPONSORED RESEARCH OR DEVELOPMENT

This invention was made with Government support under contract number NBCH 3039004 awarded by the Defense Advanced Research Projects Agency (DARPA) The government has certain rights in this invention.

FIELD OF THE INVENTION

The present invention generally relates to the electrical and electronic arts and, more particularly, to techniques for characterization of electronic memory circuits and the like.

BACKGROUND OF THE INVENTION

The variations in process parameters increase with technology scaling. Process variation includes global systematic variation and local device mismatch, as shown at 102, 104, respectively in FIG. 1. Both components increase with scaling and limit circuit yield. The effects of variation are particularly significant for design of static random access memory (SRAM). Thus, characterization of local mismatch and global systematic variation is quite pertinent for SRAM yield.

Local random variation in transistors increases with technology scaling and can degrade circuit robustness. Due to random variations, such as random dopant fluctuation (RDF) or line-edge roughness (LER), neighboring transistors in a die can have significant mismatch in their characteristics. The effect of this local randomness is most pronounced in area-constrained circuits, such as SRAM cells, and limits the density scaling. Hence, measurement, characterization, and modeling of local random variability in the process are of interest for yield learning and yield enhancement in nano-scaled technologies, particularly, for SRAM design. Traditionally, mismatch characterization between neighboring devices is performed by measuring the current difference between nominally identical transistors, such as 202 and 204 in FIG. 2, and extracting the threshold voltage (Vt) difference from the current difference using complex data extraction tools. This method requires sophisticated analog measurements and complex data extraction methods, which significantly increase the test-time, and make it unsuitable for in-line and/or on-chip characterization.

The systematic variations in cell transistors also significantly impact cell failures. As shown in FIG. 3, traditionally, the systematic variation is characterized by distributing on-chip ring-oscillators 302 across a chip and measuring the frequency. However, such a measurement cannot accurately predict the systematic variation in SRAM cell (systematic variation is a strong function of cell layout).

The conventional 6-transistor (6T) SRAM 400, depicted in FIG. 4, includes a first inverter formed by p-type and n-type field effect transistors (PFET and NFET, respectively) PL and NL (numbered 402 and 404), cross-coupled to a second inverter formed by PFET PR and NFET NR, numbered 406, 408. The cross-coupled inverters are connected to a voltage supply node 410 and a ground 412. Left and right NFET access devices SL, SR, numbered 414 and 416, interconnect true bit line 418 and complementary bit line 420 to storage nodes 426, 424 under control of word line 422.

SUMMARY OF THE INVENTION

Principles of the present invention provide techniques for characterizing device variation in static random access memory cells and the like. In one aspect, an exemplary circuit includes a comparator circuit having first and second inputs and an output, the comparator circuit being configured such that the output of the comparator circuit toggles from a first digital logical level to a second digital logical level when the first and second inputs transition between a first state wherein the first input has an applied voltage greater than an applied voltage at the second input and a second state wherein the first input has an applied voltage less than an applied voltage at the second input. Essentially, if a fixed voltage is applied at the second input, the comparator circuit measures when the first input voltage is equal to the second input. The exemplary circuit also includes a plurality of cells, each of the cells having at least one series-connected pair of field effect transistors interconnected at an output node intermediate the field effect transistors. Each of the transistors has a gate. The exemplary circuit still further includes decoding logic configured to select a given one of the cells for measurement, and selectively interconnect the output node of the given one of the cells to the first input of the comparator circuits.

The exemplary circuit can work with external or on-chip voltage supply circuitry Such circuitry is configured to apply voltages to the gates of the pair of transistors of the given one of the cells selected for measurement such that the pair of transistors operate in a linear region, and have a variable voltage difference, $\Delta$, between their gate-to-source voltages. The voltage supply circuitry is further configured to vary the $\Delta$ until the comparator circuit output toggles from the first digital logical level to the second digital logical level.

In another aspect, an exemplary method for characterizing local random variation in a static random access memory includes the steps of obtaining a test circuit having a plurality of cells, digitally measuring an offset voltage for each of the cells, and, based on the digital measuring, estimating a standard deviation of random variation for each device (that is, the individual transistors in the pair).

In yet another aspect, an exemplary method for characterizing systematic and local random variation in a static random access memory includes the steps of obtaining a test circuit having a plurality of cells, selecting a predetermined group of the cells for test, and digitally measuring an offset voltage for each of the cells in the predetermined group. The method further includes estimating a standard deviation of the offset voltage (based on the digital measuring) to measure the random variation, and estimating a mean of the offset voltage to predict systematic shift (that is, inter-die shift and the like).

One or more embodiments of the invention may be realized, in whole or in part, in the form of an integrated circuit.

These and other objects, features and advantages of the present invention will become apparent from the following detailed description of illustrative embodiments thereof, which is to be read in connection with the accompanying drawings.

BRIEF DESCRIPTION OF THE DRAWINGS

FIGS. 12-17 show a number of exemplary transistor pairs that may be tested, according to even further aspects of the invention;

DETAILED DESCRIPTION OF PREFERRED EMBODIMENTS

Figure 1:
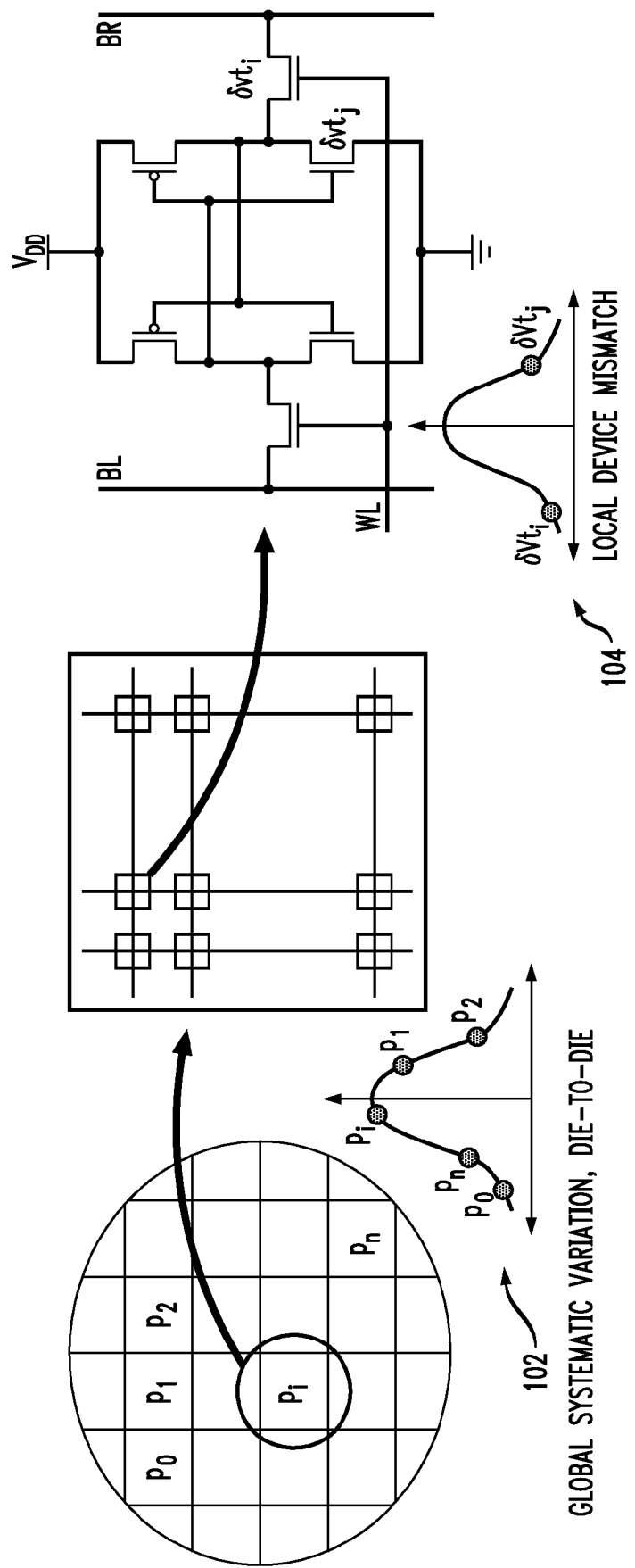
FIG. 1 shows prior art global systematic and local random mismatch in process.
Figure 2:
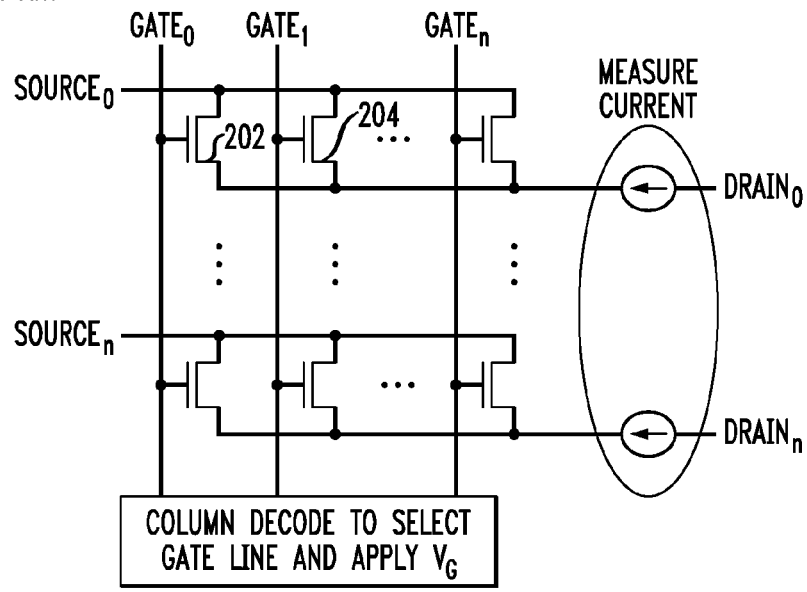
FIG. 2 shows prior-art current-voltage measurement for local variability characterization.
Figure 3:
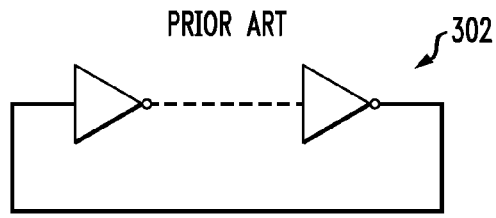
FIG. 3 shows prior-art ring-oscillator based characterization for systematic variation.

An on-chip and in-line testing method, according to one or more implementations of the invention, can significantly reduce the characterization time, compared to prior-art techniques, and can facilitate faster technology development (particularly, development of SRAM technology). In SRAM cell 400, the global systematic and local random variability characterization for all devices is of interest. The local random variability (or mismatch) characterization is required not only for identical devices (e.g. pull-down NMOSs 404, 408 and pull-up PMOSs 402, 406) but also for non-identical devices (i.e. between pass gate & pull-down, pass-gate & pull-up and pull-up & pull-down). This makes the characterization process even more challenging, as the inherent device differences (due to different device structures, threshold voltages (Vts), mobilities, and the like between the above-mentioned pairs) need to be excluded from the mismatch due to process. For characterization of global systematic variation it is quite desirable that the characterization circuit preserves the actual cell layout as global systematic variation strongly depends on layout. Thus, characterization of systematic variation can advantageously be done, using one or more inventive circuits and/or methods, by using the SRAM cell devices in the cell layout environment. Further, the characterization of systematic variation using cell layout, according to one or more aspects of the invention, enhances understanding of the impact of systematic variation on local random mismatch.

The ability to simultaneously characterize the systematic variation and local mismatch in cell transistors, using the same characterization circuit and measurement scheme, is an advantage of one or more inventive embodiments. A further advantage of one or more embodiments is the ability to perform the characterization in the cell itself (that is to say, not using transistor pairs outside the cell environment), as the layout and environment of the cell can impact device mismatch and systematic shift. As will be discussed below, in one or more exemplary embodiments, the changes required to the actual cell layout, for characterization purposes, are minimized. This provides the advantage of helping to obtain true mismatch and systematic variation values for devices in a product-line SRAM cell, and facilitates yield enhancement and/or learning with regard to SRAM products.

One or more embodiments of the invention provide one or more of a test-structure and characterization technique for fast, on-chip, in-line and digital measurement of local mismatch and systematic shift in identical as well as non-identical devices in an SRAM cell. One or more exemplary inventive circuits provide a direct measure of process-induced random and systematic shift in the threshold voltage of the different devices within an SRAM cell. Thus, one or more inventive embodiments provide test-circuit and analysis methods for fast, on-chip, in-line, and reliable characterization of mismatch between transistors and their systematic shift in an SRAM cell using a digital measurement technique.

One or more inventive implementations may provide one or more of the following advantages over previous know solutions:

using the same on-chip test circuit and characterization method to simultaneously characterize local mismatch and global systematic shift in device Vt for both identical and non-identical devices in an SRAM cell.

measuring mismatch between identical and non-identical transistors.

employing a digital measurement method for random variability characterization.

providing a direct measurement of the complete distribution of random and systematic Vt shifts.

not requiting sophisticated analog current-voltage measurement and complex data extraction methods that are essential in conventional differential current measurement schemes.

implementation in an on-chip, in-line test environment, enabling the possibility of built-in-self-characterization of variability in SRAM cell transistors.

significantly reducing characterization time compared to conventional methods.

measuring random and systematic variation in cell transistors with minimal changes in the actual cell layout and environment, thus providing a substantially true picture of process variation in cell transistors and yield of SRAM product.

One or more inventive implementations may have one or more of the following applications:

use in current and/or future SRAM technology for fast, on-chip, in-line characterization of random and systematic variation in cell transistors, which may facilitate faster development of robust SRAM technology.

Can characterize impact of different cell structures and/or layouts on variability in cell transistors.

Fast characterization enables the use of one or more inventive embodiments as a macro for in-line test during SHAM technology development.

Fast characterization will allow better optimization of SRAM cells, resulting in better SRAM yield.

Can characterize impact of emerging device structure on SRAM stability to understand possible device alternatives for future technology.

use to design on-chip adaptive repair schemes to improve process variation tolerance of SRAM; for example, monitoring cell transistors' variability in an SRAM chip and adaptively (die-to-die adaptation or time-dependent adaptation) changing the supply voltage (or well bias) to reduce cell failures.

Figure 4:
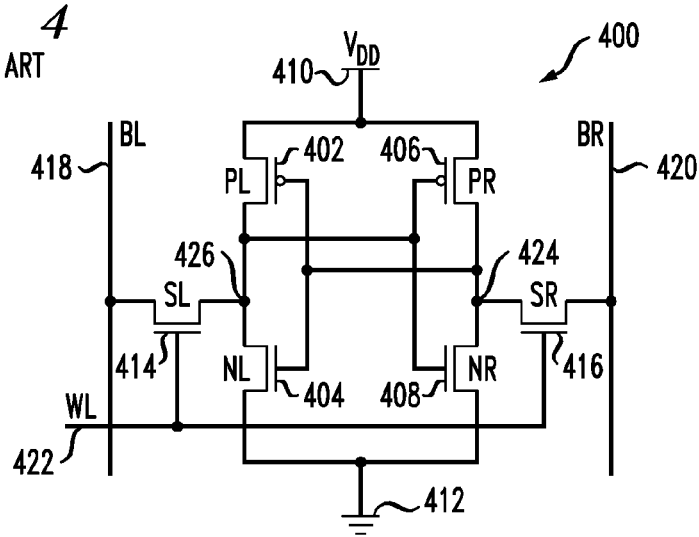
FIG. 4 shows a prior-art six-transistor (6T) SRAM cell.

Still considering the schematic of the 6-T SRAM cell in FIG. 4, note that parameter variation can result in read and write failures in such a cell. The read failure happens when the cell flips while reading. On the other hand, write failure happens if the cell data cannot be flipped while writing to a cell. Both random variation and/or mismatch within the cell transistors and the systematic shift in cell transistors increase the probability of such failures. Hence, it is desirable to characterize both random variation (which results in mismatch between cell transistors) and systematic variation (which moves the cell in different corners and amplifies the effect of random variation) in the cell transistors. Exemplary inventive techniques to characterize variation in different cell transistors will now be presented.

Figure 7:
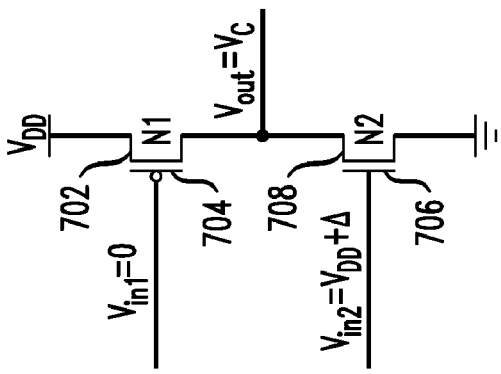
FIG. 7 shows a PMOS-NMOS FET pair configured for characterization according to yet another aspect of the invention.
Figure 6:
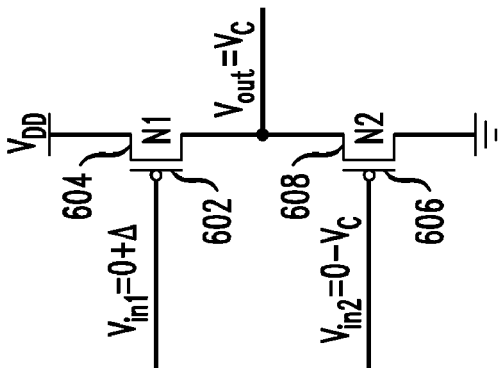
FIG. 6 shows a p-type metal oxide semiconductor (PMOS) FET pair configured for characterization according to another aspect of the invention.
Figure 5:
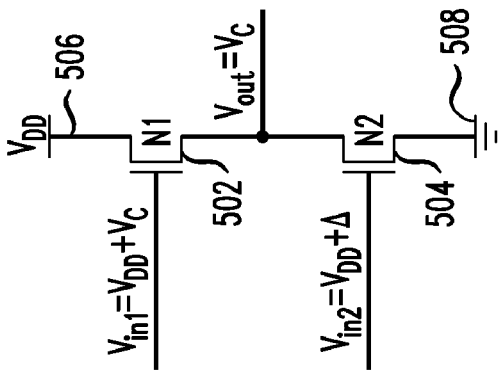
FIG. 5 shows an n-type metal oxide semiconductor (NMOS) field effect transistor (FET) pair configured for characterization according to an aspect of the invention.

Giving attention now to FIGS. 5-7, one inventive concept is based on the effect of process variation on the intermediate node voltage of two series connected transistors. These two series connected devices depicted therein are the devices under test (DUT). One or more inventive techniques are based on the effect of variability on the intermediate node voltage of two series connected transistors operating in the linear region.

Specific attention should now be given to FIG. 5, which depicts the case of two series connected NMOS transistors, 502 and 504. The drain 506 of $N_1$ is biased at $V_{DD}$ and the source 508 of $N_2$ is biased at ground (GND). Moreover, $V_{in1}=V_{DD}+V_C$, $V_{in2}=V_{DD}+\Delta$. To measure the mismatch we vary $\Delta$ to obtain $V_{out}=V_C$, where $V_C$ is selected "a priori" to make sure both the transistors are in the linear region. The $V_{DD}$ should be the nominal $V_{DD}$ for a given technology node. For example, for technologies below 100 nm, 1-1.2V is a good choice. A significant factor is that it should be sufficiently (2-3×) higher than the threshold voltage of the devices. The final $\Delta$ value required to achieve $V_{out}=V_C$ is defined as the "offset voltage" and is used to measure variability. In one or more inventive techniques, we select $V_C=V_{DD}/2$. The output voltage ($V_{DD}/2$) is determined by the current through $N_1$ and $N_2$ as shown below:

$$I_{N1} = \beta_{N1}\left[(V_{DD}+V_C-V_C-V_{tN1})-\frac{1}{2}\frac{V_{DD}}{2}\right]\frac{V_{DD}}{2} \quad \text{(Eq. 1)}$$

$$= I_{N2}$$

$$= \beta_{N2}\left[(V_{DD}+\Delta-V_{tN2})-\frac{1}{2}\frac{V_{DD}}{2}\right]\frac{V_{DD}}{2}$$

$$\Rightarrow \Delta = \left(\frac{\beta_{N1}}{\beta_{N2}}-1\right)V_{DD} - \left(\frac{\beta_{N1}}{\beta_{N2}}V_{tN1}-V_{tN2}\right) - \frac{1}{2}\left(\frac{\beta_{N1}}{\beta_{N2}}-1\right)\frac{V_{DD}}{2}$$

Let us now assume, $$r=\beta_{N1}/\beta_{N2},\ V_{tN1}=V_{tN10}+\Delta V_{t_{sys}}+\delta V_{t_{rand\_N1}},$$
$$V_{tN2}=V_{tN20}+\Delta V_{t_{sys}}+\delta V_{t_{rand\_N2}} \quad \text{(Eq. 2)}$$

Using the above equations we obtain:

$$\Delta = \frac{3}{4}(r-1)V_{DD} - (rV_{tN10}-V_{tN20}) - (r-1)\Delta V_{t_{sys}} - (r\delta V_{t_{rand\_N1}} - \delta V_{t_{rand\_N2}}) \quad \text{(Eq. 3)}$$

$$\Rightarrow \Delta = \underbrace{\frac{3}{4}(r-1)V_{DD} - (r-1)V_{tN10} + \Delta V_{t_{dev}}}_{\text{constant}} - \underbrace{(r-1)\Delta V_{t_{sys}}}_{\text{systematic shift}} - \underbrace{(r\delta V_{t_{rand\_N1}} - \delta V_{t_{rand\_N2}})}_{\text{random mismatch}}$$

where, $V_{tN20}=V_{tN10}+\Delta V_{t_{dev}}$;

$\Delta V_{t_{dev}}$ is the inherent $Vt$ mismatch between the devices

Figure 8:
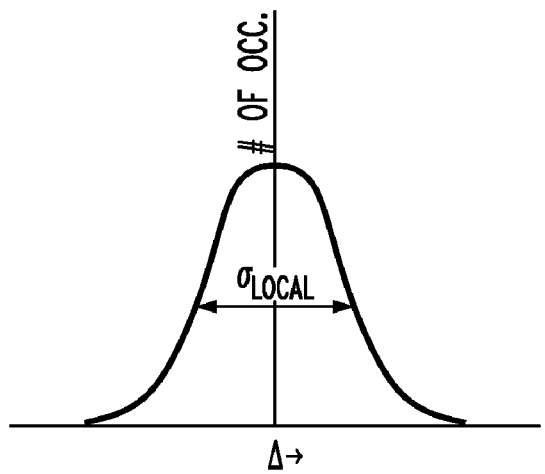
FIG. 8 depicts voltage differential (Δ) distribution for identical devices in a die, according to still another aspect of the invention.
Figure 9:
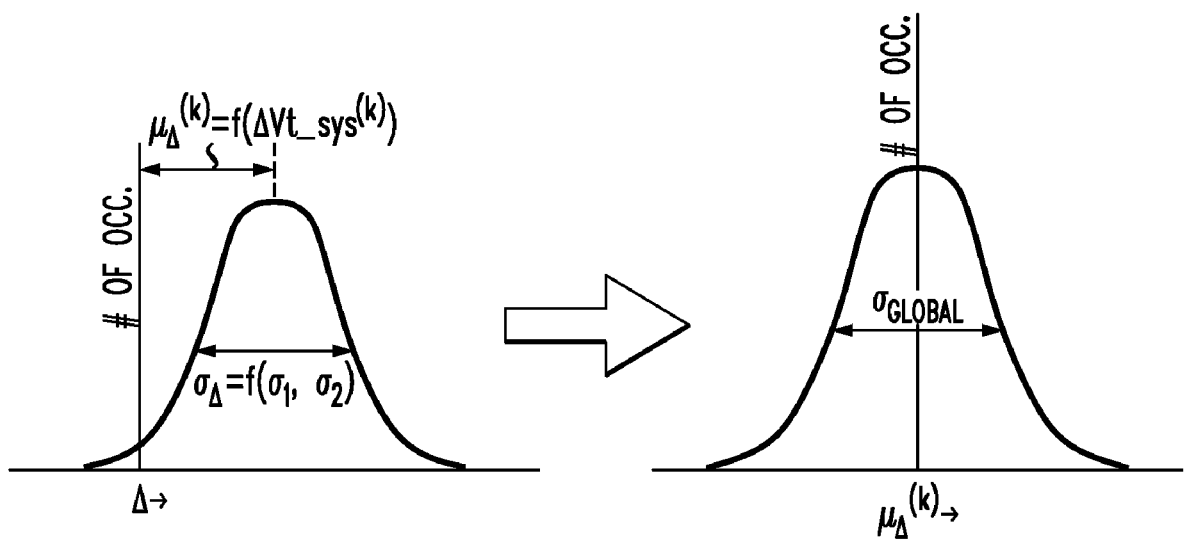
FIG. 9 depicts voltage differential (Δ) distribution for non-identical devices in a die, used to characterize a large number of dies, according to a further aspect of the invention.

To obtain the variability information we follow a two-step process, as shown in FIG. 8. It should be noted that use of terminology such as "we" and the like does not necessarily imply human agency, but also includes steps carried out automatically under control of a computer processor, or in a combination of manual and automatic techniques. First, we select a group of test-circuits located within a certain spatial proximity (within which the systematic shift is expected to be constant, that is, we can consider all the DUTs in a die as one group if we are characterizing the systematic shift due to die-to-die variation). The offset voltages of the different DUTs within that group are measured and the distribution of the "offset voltage" is a direct indicator of the variability. If we are considering two identical devices (e.g. two pull-down devices), the standard deviation of the local Vt mismatch is the same as the standard deviation of the measured "offset" distribution. For non-identical devices, as shown in FIG. 9, we can obtain both the local and global variation for this measurement. Let us consider the distribution for group (i). The mean ($\mu^{(i)}$) and the standard deviation ($\sigma^{(i)}$) obtained from measuring cells within the group (i) are given by:

$$\mu_\Delta^{(i)} = \frac{3}{4}(r-1)V_{DD} - (r-1)V_{tN10} + \Delta V_{t_{dev}} - (r-1)\Delta V_{t_{sys}}^{(i)} \text{ and} \quad \text{(Eq. 4)}$$

$$\sigma_\Delta^{(i)} = \sqrt{r^2\sigma_{N1}^2 + \sigma_{N2}^2}$$

Since, $N_1$ and $N_2$ are in close spatial proximity and very small in size, we can assume the random variation is primarily due to random dopant fluctuation, and follows its property(ies). Hence, the random variability of the individual devices is obtained as:

$$\sigma_\Delta^{(i)} = \sqrt{r^2\sigma_{N1}^2 + \sigma_{N2}^2} \text{ and} \quad \text{(Eq. 5)}$$

$$\sigma_{N2} = \sigma_{N1}\sqrt{(W_{N1}/W_{N2})(L_{N1}/L_{N2})}$$

$$= s\sigma_{N1}$$

$$\Rightarrow \sigma_{N1} = \frac{\sigma_\Delta^{(i)}}{\sqrt{(r^2+s^2)}} \text{ and}$$

$$\sigma_{N2} = \frac{\sigma_\Delta^{(i)}}{\sqrt{r^2+s^2}}$$

Hence, from measurement and knowledge of beta-ratio and size-ratio, one can obtain the random variability. Moreover, the measured offset distribution (after correction for the mean shift) directly gives the complete Vt mismatch distribution. On the other hand, the systematic variation essentially results in a shift in the mean of the distribution from its otherwise expected value. If the $Vt_{N10}$ and $\Delta Vt_{dev}$ are known, we can compute the exact systematic shift for each group. Even if this information is not known, one can obtain the standard deviation of the systematic variation by measuring the standard deviation of the distribution of $\mu_A^{(i)}$ obtained by measuring different groups as:

$$\sigma_{sym} = \frac{\sigma_{\mu\Delta}}{(r-1)}. \quad \text{(Eq. 6)}$$

It should be noted that the mean of the distribution of $\mu_A^{(i)}$ provides information about inherent mismatch between N1 and N2 (due to different Vts, sizes, mobilities, and the like) Hence, the distribution of $\mu_A^{(i)}$ (after collection for mean shift) provides a direct measurement of the complete distribution of systematic variation, and using one or more inventive techniques, one can characterize both local random and systematic variability.

The above-discussed technique is applicable for variability characterization of all of the different device pairs available in SRAM (such as pull-down & pull-down, pull-up & pull-up, pull-down & pass-gate, pull-up & pass-gate, and pull-up & pull-down). For PMOS-NMOS pairs, as shown in FIG. 7, PMOS device 702 is connected to $V_{DD}$ and $V_{in1}=0$ (gate 704 of device 702). The gate 706 of NMOS device 708 has the same input as device N2 in FIG. 5.

For the case of two PMOS devices, as shown in FIG. 6, $V_{in1}=0+\Delta$ (gate 602 of device 604), and $V_{in2}=0-V_C$ (gate 606 of device 608). It is not generally possible to characterize systematic shift using the pull-down & pull-down or pull-up & pull-up pairs (r=1). Systematic shift can be characterized using device pairs with non-identical β. One or more inventive embodiments can characterize systematic variation both for (a) the same systematic shift for NMOS and PMOS, and (b) different systematic shifts for NMOS & PMOS, as shown below:

For NMOS and PMOS  (Eq. 7)

$(PMOS \equiv N1, NMOS \equiv N2, r = \beta_P/\beta_N)$:

$$\Delta = \frac{3}{4}(r-1)V_{DD} - (r-1)Vt_{P0} + \Delta Vt_{dev} -$$
$$(r\Delta Vt_{sysP} - \Delta Vt_{sysN}) - (r\delta Vt_{rand\_P} - \delta Vt_{rand\_N})$$

$$\Rightarrow \sigma_{\mu_\Delta} = \sqrt{r^2\sigma_{sysP}^2 + \sigma_{sysN}^2}$$

First, characterize systematic shift for pass-gate and pull-down to obtain $\sigma_{sysN}$.

Next, characterize systematic shift for pass-gate and pull-up to obtain $\sigma_{sysP}$.

Figure 10:
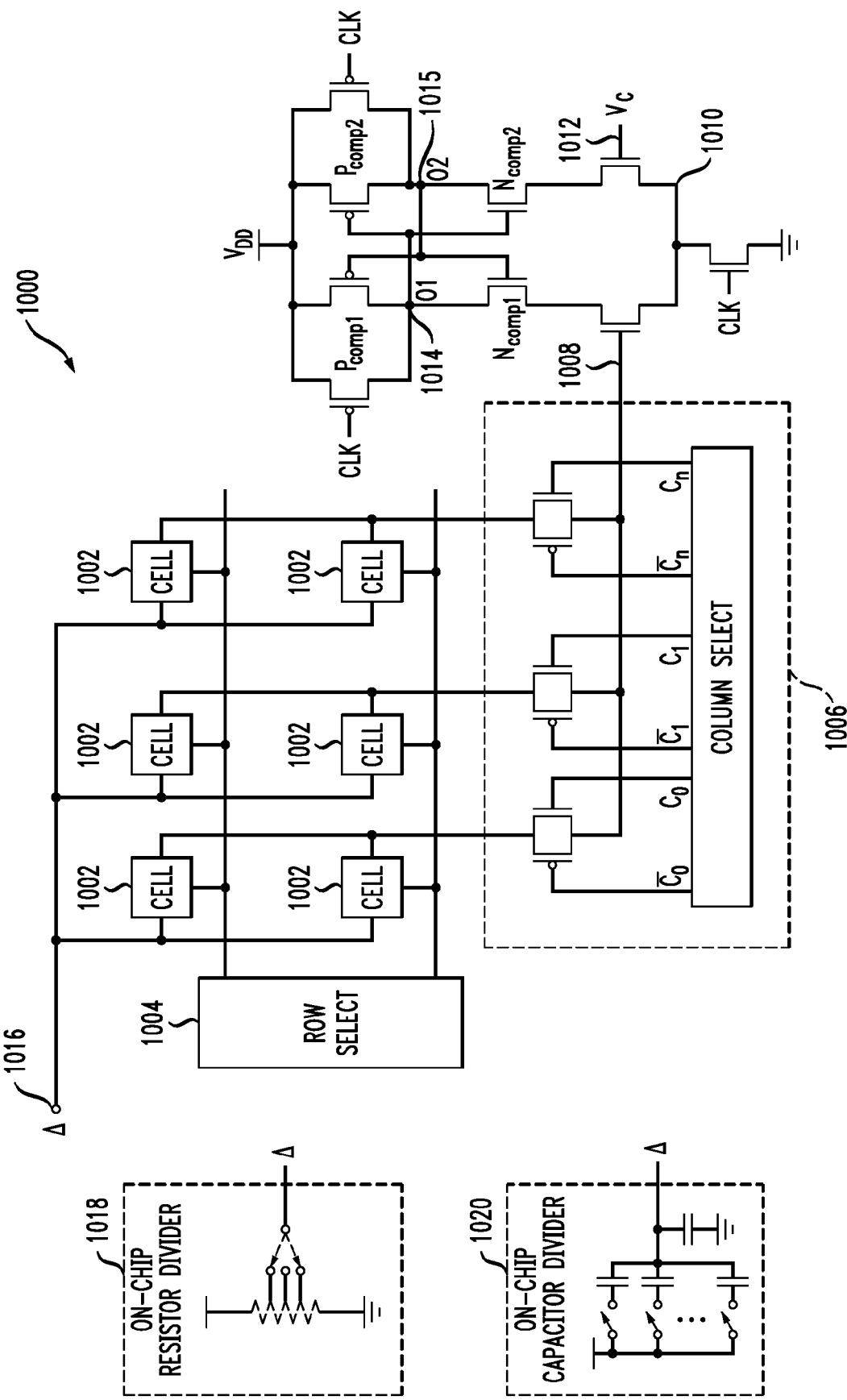
FIG. 10 depicts an exemplary embodiment of an inventive circuit, according to yet a further aspect of the invention.

FIG. 10 shows an exemplary inventive circuit schematic 1000 for obtaining the digital measurement of the offset voltage (Δ). The SRAM cells 1002 can be configured to measure different transistor pairs (detail presented hereinafter). Decoding logic, for example, formed by row select logic 1004 and column select unit 1006, is used to select a particular cell 1002 for measurement. The outputs ($V_{out}$ in FIGS. 5-7) from different cells 1002 are connected to one input 1008 of a comparator circuit such as current latch type sense-amplifier (CLSA) 1010. The voltage $V_C(=V_{DD}/2)$ is applied to the other input 1012 of the CLSA (or other comparator) and Δ (in the expression $V_{in2}=V_{DD}-\Delta$, or other appropriate expression for the type of pair under test, as discussed with regard to FIGS. 5-7 and 12-17) is varied till we get a transition in the output 1014, 1015 of the CLSA (discussed further below), which indicates that the two inputs of the CLSA are equal (i.e. $V_{out}$ is equal to $V_C$), or, stated in another way, have passed from a first state where their difference had a first sign to a second state where their difference has the opposite sign. The Δ required for transition can be measured for all the cells and used to characterize variability. The Δ value at terminal 1016 can be applied off-chip or generated on-chip using a resistor-divider or capacitor-divider network 1018, 1020, respectively. The CLSA is preferably designed using large transistors to minimize "offset." However, since the CLSA offset is added to all the measurements, it does not affect the variability characterization process.

With regard to the output of the CLSA, one output of the CLSA is the node 1014 (also referred to as O1) and the other output is the node 1015 (also referred to as O2). O1 and O2 are the complements of each other. If the first input (1008) of CLSA is larger than the second input 1012, O1 will be a logical zero and O2 will be a logical one. Similarly if the voltage at 1008 is smaller than the voltage at 1012, O1 will be a logical one and O2 will be a logical zero. Elsewhere herein, including the claims, we refer to a comparator circuit with an output that toggles from a first to a second digital logical state; this should be understood to include, for example, an output formed by nodes 1014 (O1) and 1015 (O2) which toggle as described in this paragraph.

In the exemplary implementation of FIG. 10, we do not need to measure any analog voltage or current. We apply an analog voltage and measure a digital output. Hence, the exemplary implementation provides a digital measurement scheme for variability characterization. Moreover, the scheme can be implemented completely on-chip (using an on-chip test controller) and in-line testing is possible as high-frequency testing, sophisticated analog voltage-current measurement, and complex data analysis are not required.

Given the description of FIG. 10, it will be appreciated that an exemplary inventive circuit can include a comparator circuit, such as CLSA 1010, having first and second inputs 1008, 1012, and an output (such as the pair of nodes 1014-1015). The comparator circuit can be configured such that the output (for example, the pair of nodes 1014-1015) of the comparator circuit toggles from a first digital logical level (for example, zero, one) to a second digital logical level (for example, one, zero) when the first and second inputs 1008, 1012 transition between (i) a first state wherein the first input has an applied voltage greater than the applied voltage at the second input and (ii) a second state wherein the first input has an applied voltage less than an applied voltage at the second input. The CLSA is a non-limiting example of such a comparator circuit.

The exemplary inventive circuit can also include a plurality of cells 1002. Each of the cells can include at least one series-connected pair of field effect transistors interconnected at an output node (as shown in FIGS. 5-7 and 12-17) intermediate the field effect transistors, with each of the transistors having a gate. The exemplary circuit can still further include decoding logic (for example, row and column select 1004 and 1006) configured to select a given one of the cells 1002 for measurement and selectively interconnect the output node of the given one of the cells to the first input 1008 of the CLSA 1010.

Off or on-chip voltage supply circuitry can be configured to apply voltages to the gates of the pair of transistors of the given one of the cells 1002 selected for measurement, such that the pair of transistors operate in a linear region, and have a variable voltage difference, $\Delta$, between them. The voltage supply circuitry can be further configured to vary the $\Delta$ until the comparator circuit output (for example, the pair of nodes 1014-1015) toggles from the first digital logical level to the second digital logical level. Examples of voltage supply circuitry include resistor divider 1018 and capacitor divider 1020. In some instances, the comparator circuit 1010, the plurality of cells 1002, the decoding logic 1004, 1006, and the voltage supply circuitry (such as 1018 of 1020) are all formed on a single integrated circuit chip. In other instances, the comparator circuit 1010, the plurality of cells 1002, and the decoding logic 1004, 1006 are all formed on a single integrated circuit chip, and the voltage supply circuitry is formed externally to the single integrated circuit chip.

Figure 11:
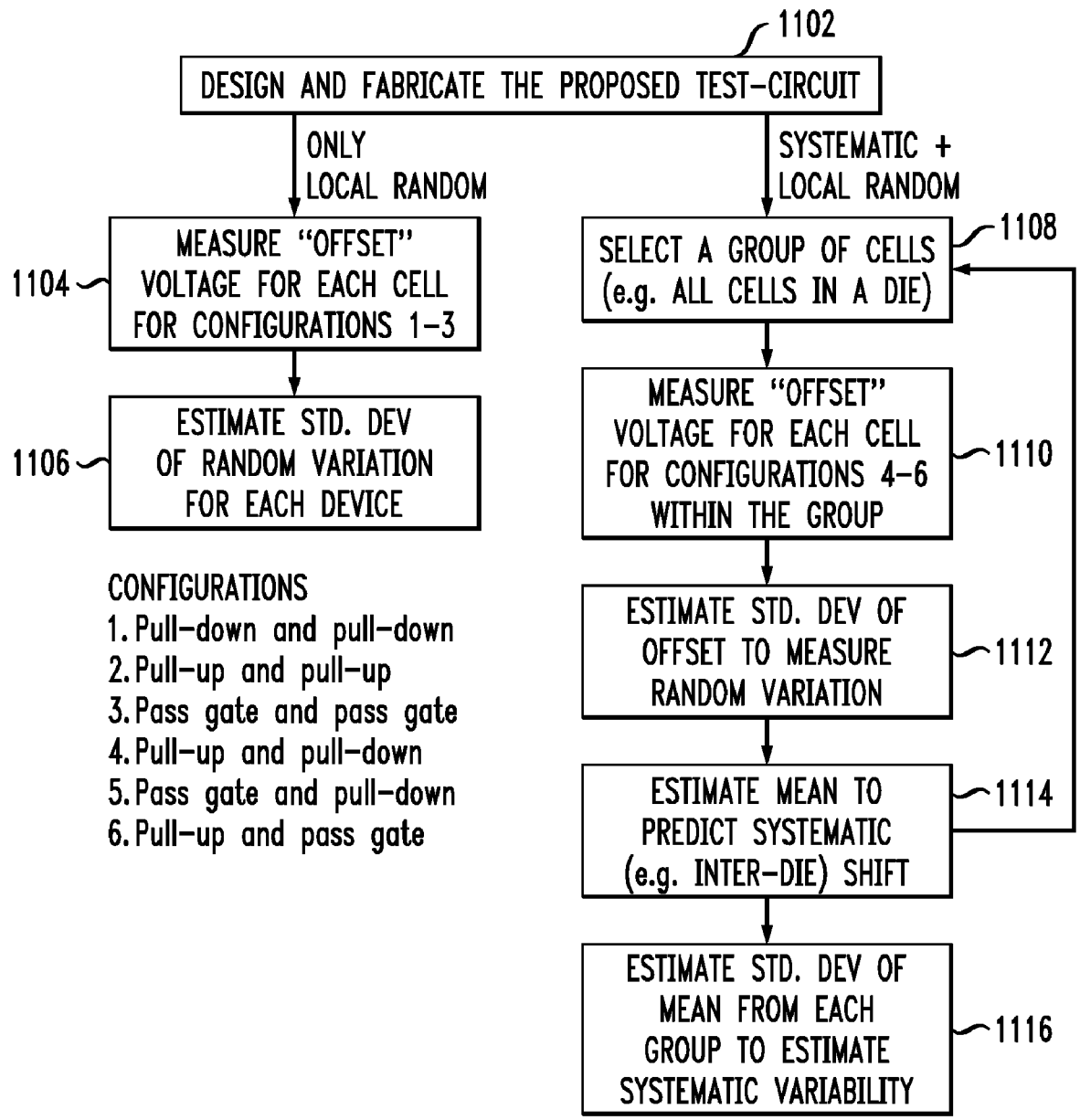
FIG. 11 depicts several exemplary methods, according to still a further aspect of the invention.

FIG. 11 shows exemplary characterization methods for local mismatch and global systematic variation. An exemplary method for characterizing local random variation in a static random access memory includes the step of obtaining a test circuit having a plurality of cells, for example, by designing and fabricating same, as at block 1102. The method further includes digitally measuring an offset voltage for each of the cells, as per block 1104. The method still further includes estimating a standard deviation of random variation for each device (individual transistors in the pair), based on the digital measuring, as at block 1106.

The offset voltage can be measured, in block 1104, for one or more of a pull-down and pull-down pair of transistors of the cells (case 1 below), a pull-up and pull-up pair of transistors of the cells (case 2 below), and a pass-gate and pass-gate pair of transistors of the cells (case 3 below).

FIG. 11 also shows an exemplary method for characterizing systematic and local random variation in a static random access memory. Such method includes obtaining a test circuit having a plurality of cells, for example, by designing and fabricating same as at block 1102. The method also includes selecting a predetermined group of the cells for test, for example, all cells in a die, as at block 1108, and digitally measuring an offset voltage for each of the cells in the predetermined group, as at block 1110. The method further includes estimating a standard deviation of the offset voltage, based on the digital measuring, to measure the random variation, as at block 1112, and estimating a mean of the offset voltage to predict systematic shift, such as inter-die shift, as at block 1114. As indicated by the arrow from block 1114 to block 1108, an additional step that can be performed includes repeating the steps 1108, 1110, 1112, 1114 for a plurality of additional groups, to obtain a plurality of means (that is, mean values). At block 1116, a standard deviation from mean can be estimated for each of the groups, to estimate systematic variability. In block 1110, the offset voltage can be measured for one or more of a pull-up and pull-down pair of transistors of the cells (case 4 below), a pass-gate and pull-down pair of transistors of the cells (case 5 below), and a pull-up and pass gate pair of transistors of the cells (case 6 below).

In the following sections we will describe different SRAM cell configurations that can be employed for measurement of different transistor pairs. It should be noted that the application to 6T cells is exemplary, and other memory cells or circuits that can be characterized by making similar limited modifications to yield series-connected transistor pairs may also benefit from inventive techniques. Further, it should also be noted that the modifications depicted hereinafter are for characterization purposes and, in general, do not allow the modified cells to function as actual SRAM cells.

1. Pull-Down & Pull-Down

Figure 12:
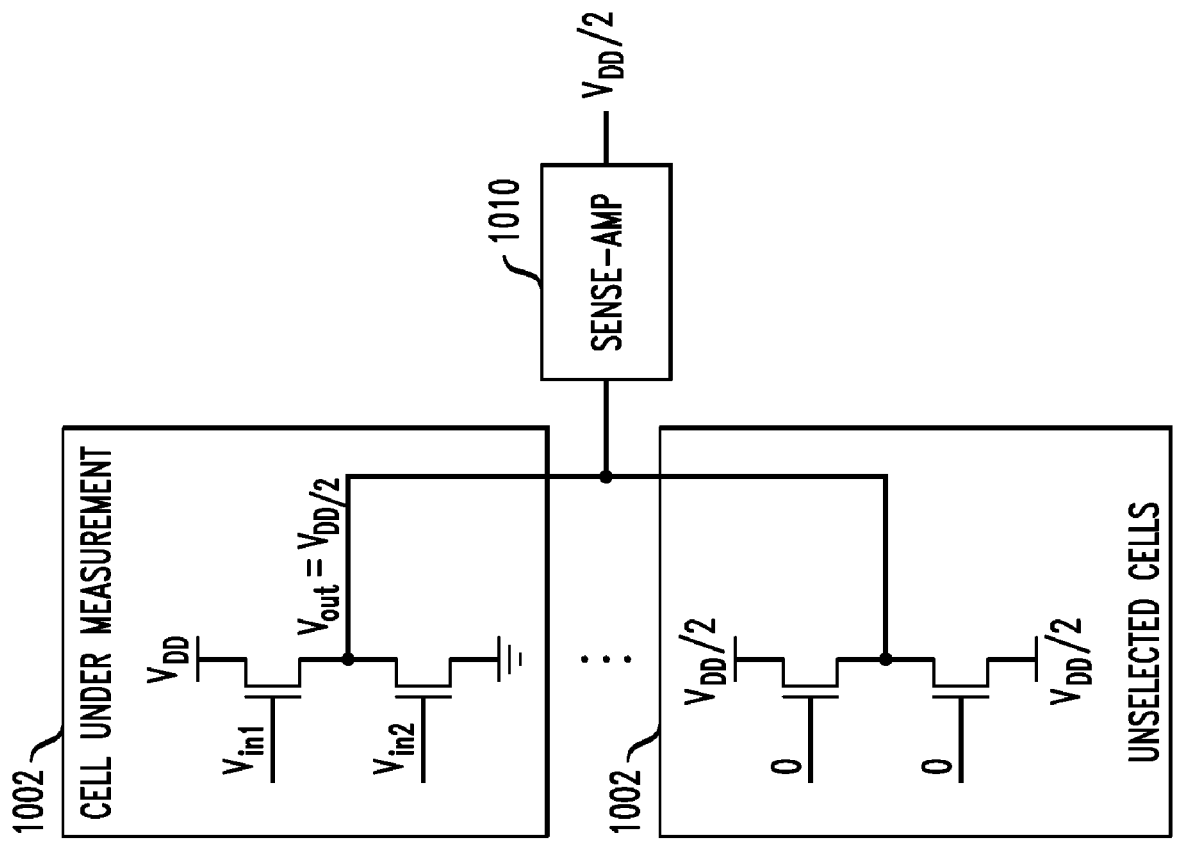
Figure 12:
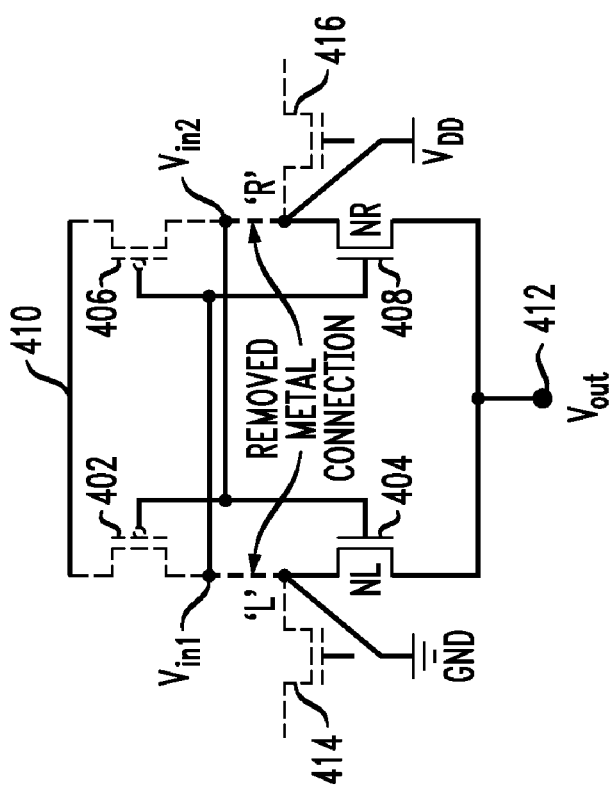

FIG. 12 shows an exemplary configuration for measuring a pull-down & pull-down pair 404, 408. In FIGS. 12-17, elements of the cell are numbered the same as in FIG. 4 and elements of the larger circuit are numbered the same as in FIG. 10. In this case, we apply $V_{DD}$ and GND to nodes "R" and "L," respectively, and use the "ground" node 412 of the cell as the "output." The output line can be shared among all the different cells. Thus, to reduce the disturbance of the output voltage due to the leakage of unselected cells, the gates of the pull-down NMOSs for those (unselected) cells are biased at "zero" and the nodes "L" and "R" are biased at $V_{DD}/2$. This sets both the NMOSs to a negative ("-ve") gate-source voltage $V_{GS}$ and significantly reduces the leakage current.

Figure 15:
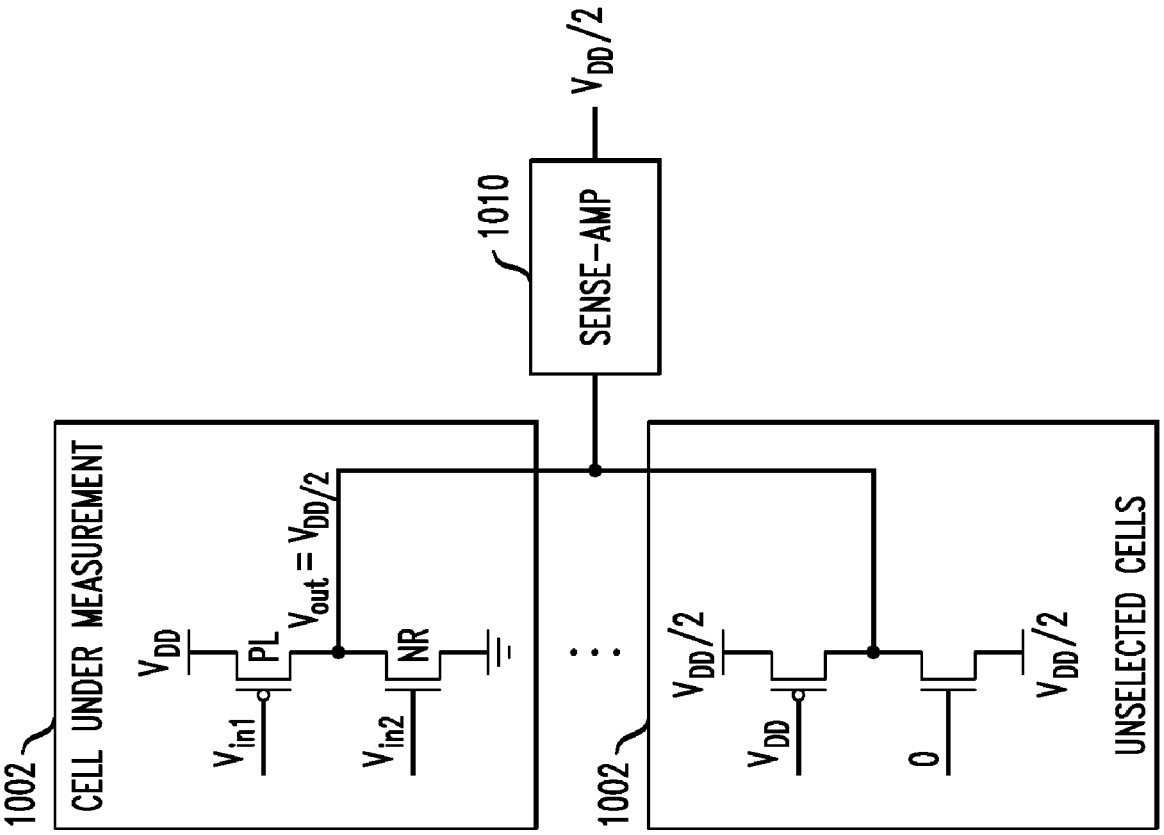
Figure 15:
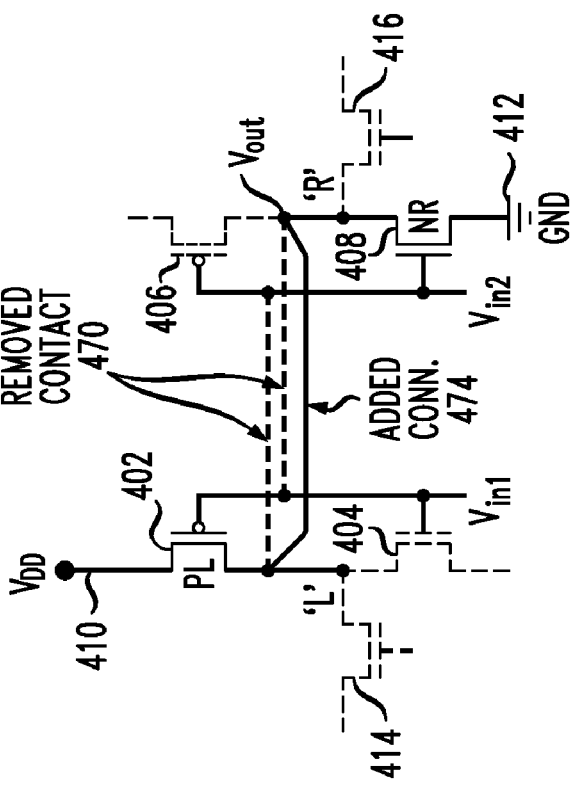
Figure 16:
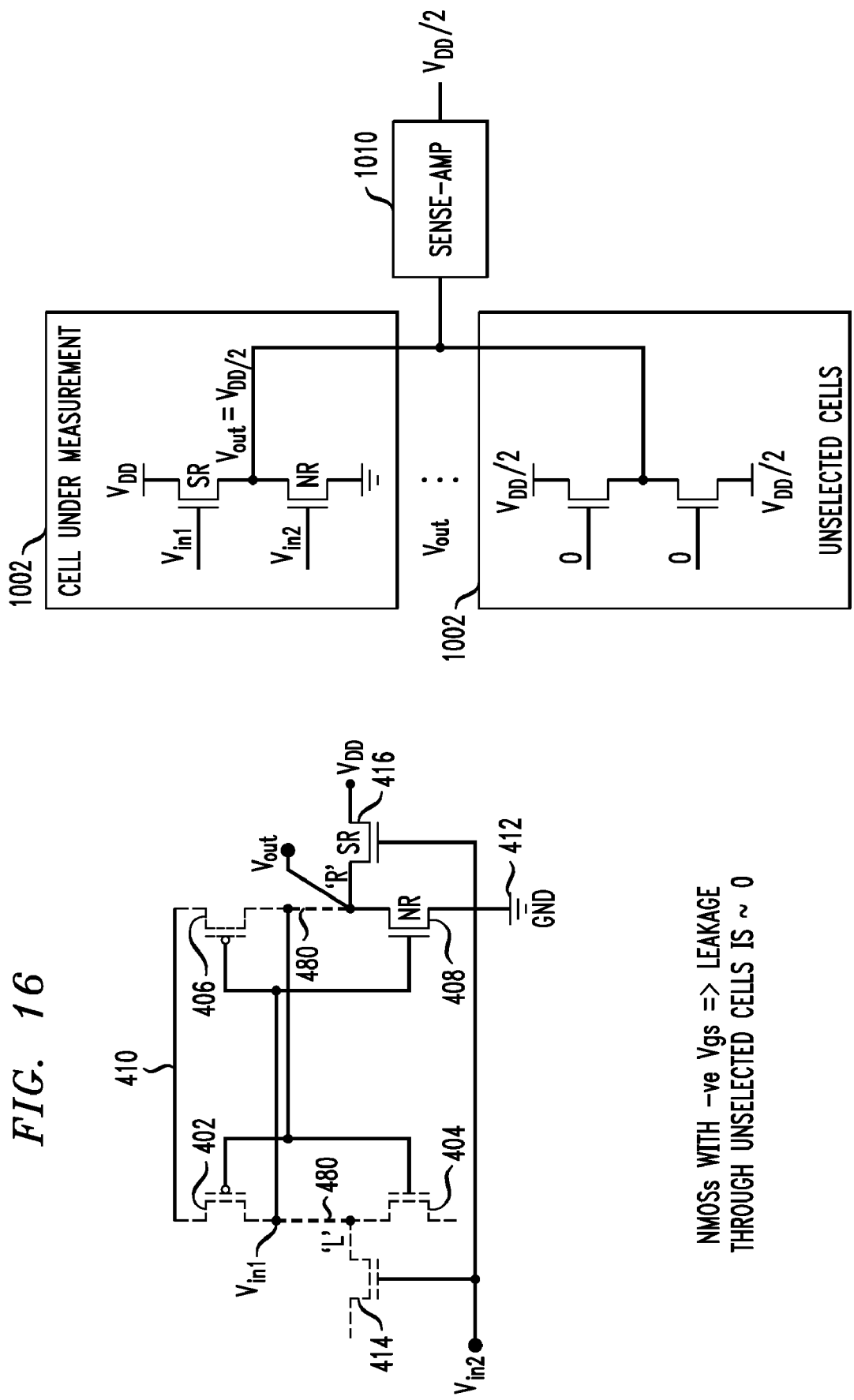

Thus, in a number of cases, such as FIGS. 12, 14 and 16, the pair of field effect transistors (DUTs) includes first and second n-type metal oxide semiconductor field effect transistors and the voltage supply circuitry is configured to apply a substantially constant supply voltage $V_{DD}+V_{DD}/2$ to the gate of the first transistor which has its drain connected to $V_{DD}$ (device NR or 408 in FIG. 12, device SR or 416 in FIG. 14, and device SR or 416 in FIG. 16) and a variable voltage $V_{DD}+\Delta$ to the gate of the second transistor which has its source connected to ground (device NL or 404 in FIG. 12, device SL or 414 in FIG. 14, and device NR or 408 in FIG. 16). In FIGS. 12-17, the cells 1002 are "nominally" 6-T static random access memory cells as described with regard to FIG. 4, but modified in accordance with inventive techniques set forth herein to allow inventive characterization. "Nominal" means, in this context, that these are the types of cells we want to test and/or characterize and which we modify in accordance with inventive techniques to allow isolating the transistor pair). The first and second n-type metal oxide semiconductor field effect transistors in FIG. 12 are the pull-down transistors 404, 408 of the given one of the cells 1002, and the cells are modified to eliminate conductive material between the pull-up and pull-down transistors, as shown by the notation "Removed metal conn." in FIG. 12.

2. Pull-Up & Pull-Up

Figure 13:
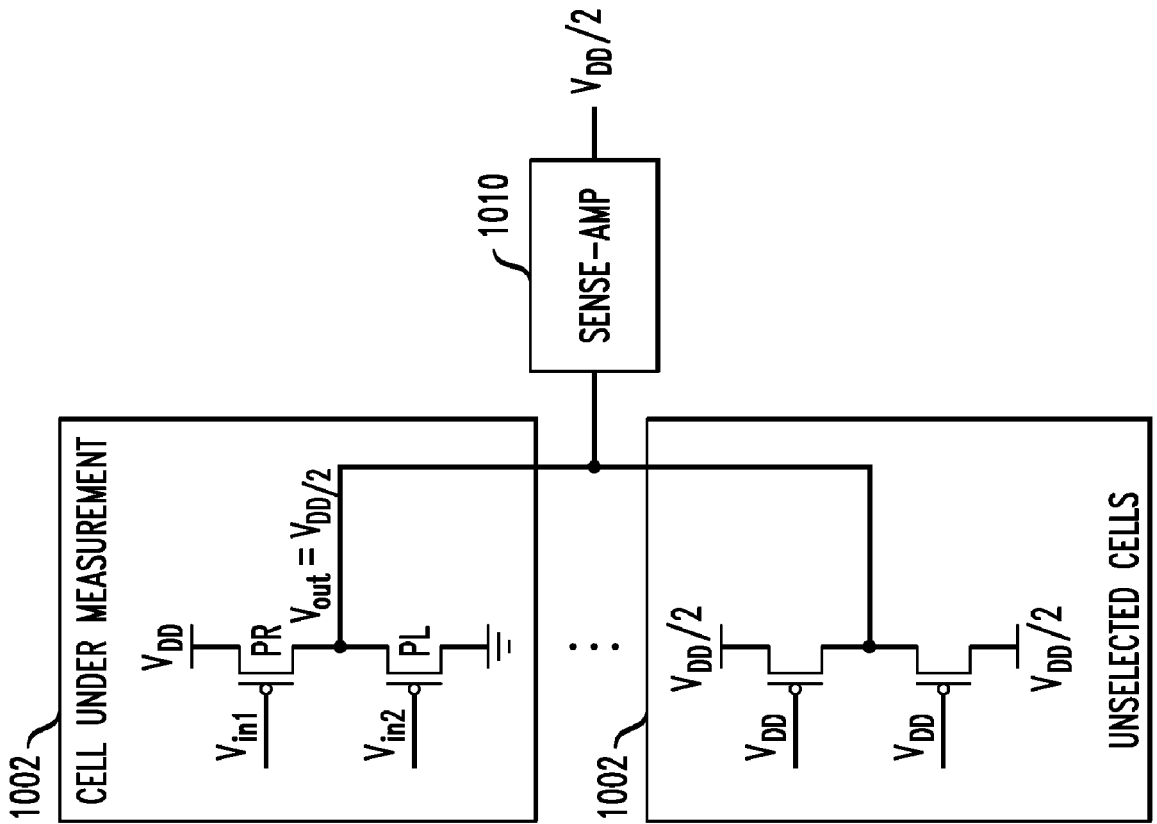
Figure 13:
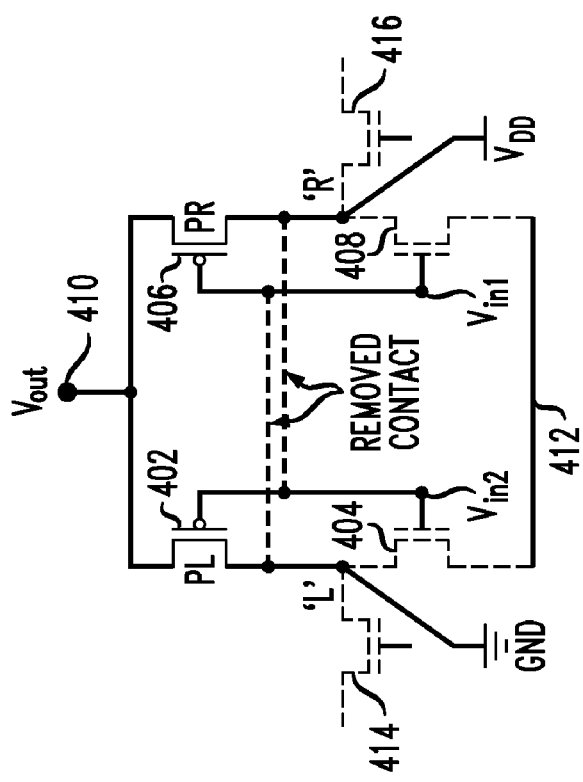

To measure the variability of pull-up pairs, we apply $V_{DD}$ and GND to the nodes "R" and "L," and use the $V_{DD}$ line of the cell 410 as the "output," as shown in FIG. 13. To reduce the output voltage disturbance, the unselected cells are biased to have both the PMOSs in a positive $V_{GS}$ condition.

Thus, in this case, the pair of field effect transistors includes first and second p-type metal oxide semiconductor field effect transistors 402, 406 and the voltage supply circuitry is configured to apply a negative $V_{DD}/2$ to the gate of the first p-type transistor which has its drain connected to GND (device PL or 402 in FIG. 13) and a variable voltage $+\Delta$ to the gate of the second p-type transistor which has its source connected to $V_{DD}$ (device PR or 406 in FIG. 13). The first and second p-type metal oxide semiconductor field effect transistors are the pull-up transistors 402, 406 and the cells are modified to eliminate cross-coupling between the inverters, as indicated by the notation "Removed contact." in FIG. 13.

3. Pass-Gate & Pass-Gate

To measure the variability between two pass gate devices, we apply $V_{DD}$ and GND to the light and left bit-lines (voltage values shown next to the terminals; bit lines not shown). Next, we need to use two WL signals for the two pass-gates and connect nodes "L" and "R". The common "L-R" node is used as the output, as shown in FIG. 14. The first and second n-type metal oxide semiconductor field effect transistors are the access transistors 414, 416 of the given one of the cells 1002, and the cells are modified to eliminate cross-coupling between the inverters, as shown by dotted lines 470, and to couple the access transistors into the series-connected pair, as shown by 472.

4. Pull-Up & Pull-Down

FIG. 15 shows an exemplary configuration for measuring the variability (both random and systematic) between pull-up & pull-down transistors. The nodes "L" and "R" are connected and used as the output. The pull-up and pull-down devices in the unselected cells are biased in the negative $V_{GS}$ mode for NMOS and positive $V_{GS}$ mode for PMOS. The n-type metal oxide semiconductor field effect transistor 408 is one of the pull-down transistors of the given one of the cells, and the p-type metal oxide semiconductor field effect transistor 402 is one of the pull-up transistors of the given one of the cells and is located on an opposite side of the cell from the n-type metal oxide semiconductor field effect transistor. The cells are modified to eliminate cross-coupling between the inverters, as shown at 470, and to couple the p-type transistor and the n-type transistor into the series-connected pair, as at 474. The voltage supply circuitry is configured to apply a zero (0) voltage to the gate of the p-type transistor which has its source connected to $V_{DD}$ (device PL or 402 in FIG. 15) and a variable voltage $V_{DD}+\Delta$ to the gate of the n-type transistor which has its source connected to GND (device NR or 408 in FIG. 15).

5. Pass-Gate & Pull-Down

FIG. 16 shows an exemplary configuration for measuring the variability (both random and systematic) between pass-gate & pull-down transistors. The bit-line is used as $V_{DD}$, the ground line of the cell is used as GND, and the intermediate node ("R") is used as the output. The wordline and node "L" are used to apply the inputs.

The first n-type metal oxide semiconductor field effect transistor 408 is one of the pull-down transistors of the given one of the cells, and the second n-type metal oxide semiconductor field effect transistor 416 is one of the access transistors of the given one of the cells, on the same side of the cell as the first n-type metal oxide semiconductor field effect transistor. The cells are modified to eliminate conductive material between the pull-up and pull-down transistors, as shown by dotted lines at 480.

6. Pull-Up & Pass-Gate

Figure 17:
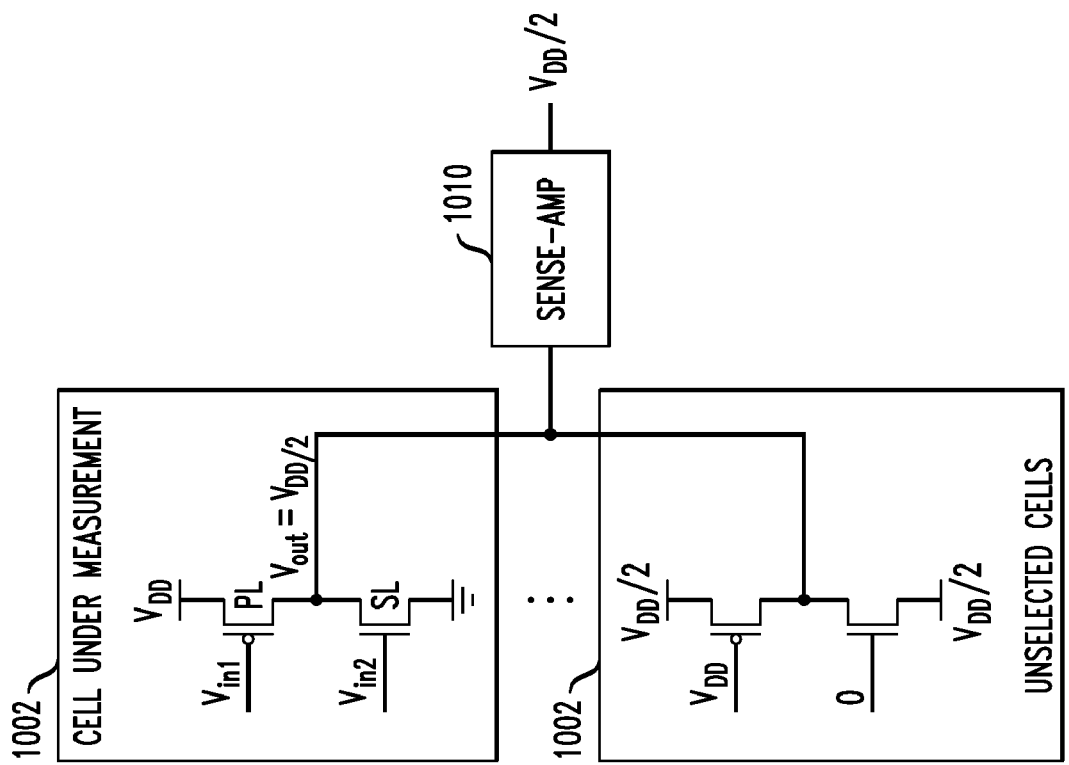
Figure 17:
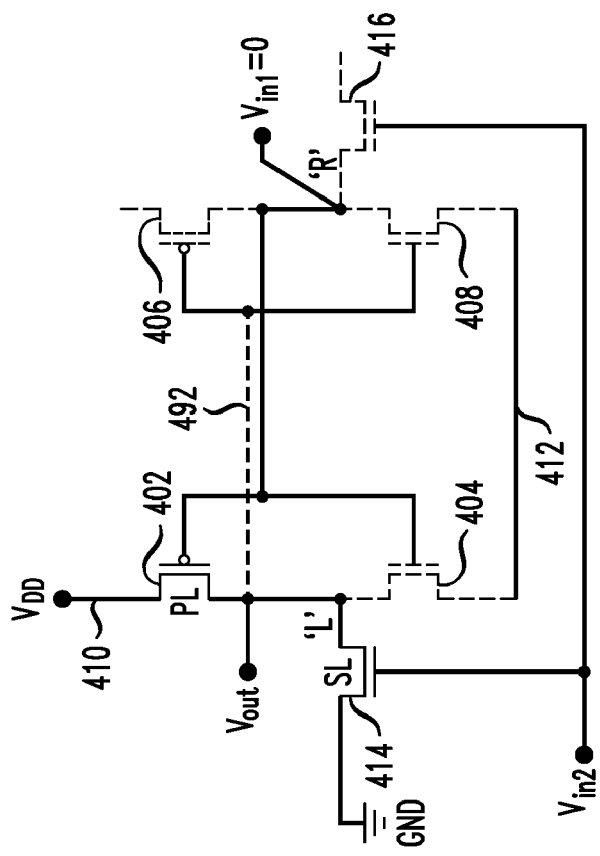

FIG. 17 shows an exemplary configuration for measuring the variability (both random and systematic) between pull-up & pass-gate transistors. The bit-line is used to provide the GND, the cell supply line is biased at $V_{DD}$, and the intermediate node ("L") is used as the output. The wordline and node "R" are used to apply the inputs.

The n-type metal oxide semiconductor field effect transistor 414 is one of the access transistors of the given one of the cells, and the p-type metal oxide semiconductor field effect transistor 402 is one of the pull-up transistors of the given one of the cells and is located on the same side of the cell as the n-type metal oxide semiconductor field effect transistor. The cells are modified to eliminate one cross-coupling between the inverters. The one eliminated cross-coupling is the one nominally interconnected to the output node, as shown by the dotted line at 492. The voltage supply circuitry is configured to apply a zero (0) voltage to the gate of the p-type transistor which has its source connected to $V_{DD}$ (device PL or 402 in FIG. 17) and a variable voltage $V_{DD}+\Delta$ to the gate of the n-type transistor which has its source connected to GND (device SL or 414 in FIG. 17).

Exemplary Simulation Results

Figure 18:
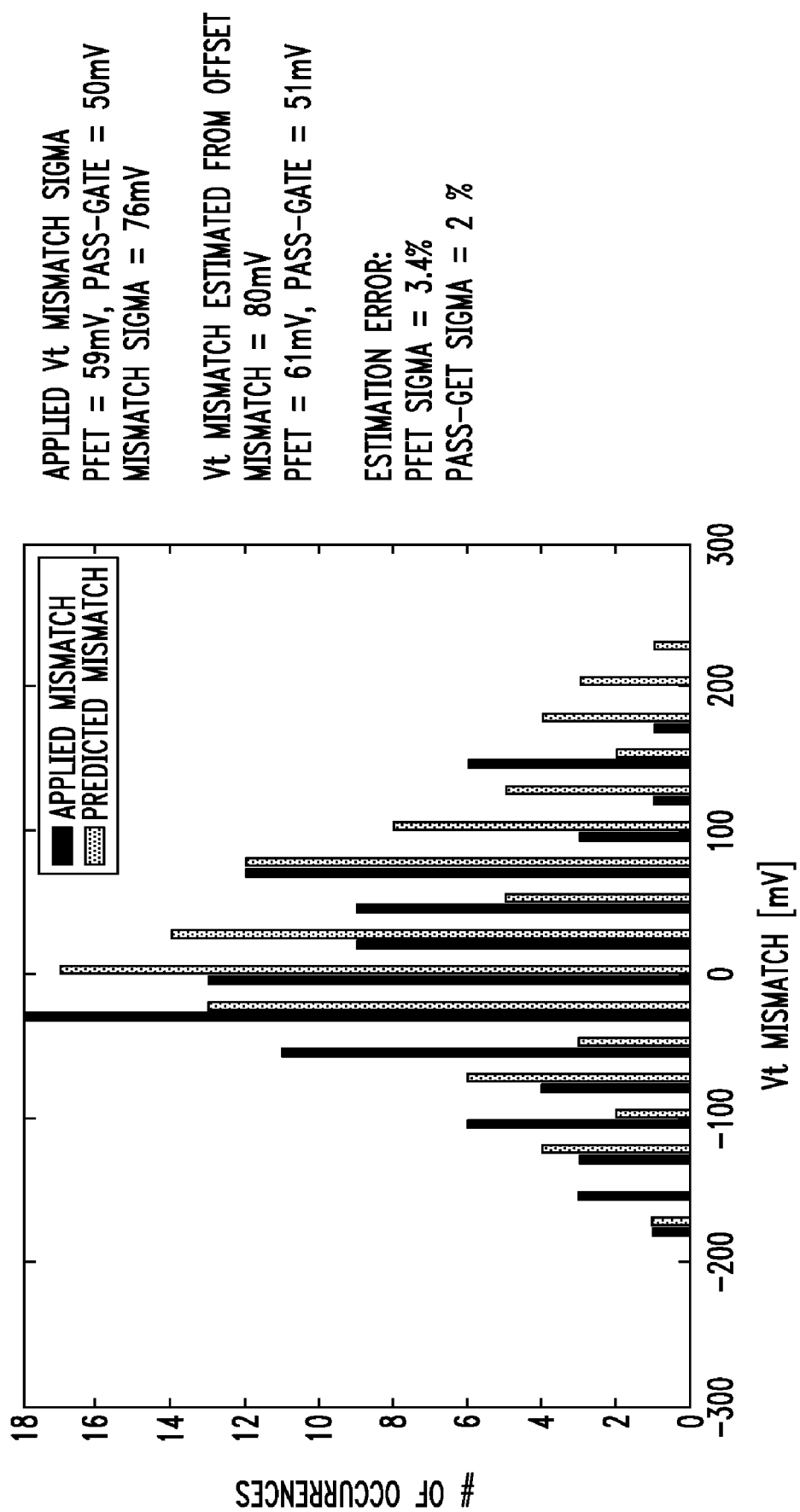
FIG. 18 shows exemplary simulation results for local variability estimation using pull-up and pass-gate devices, according to one non-limiting exemplary application of inventive techniques.
Figure 19:
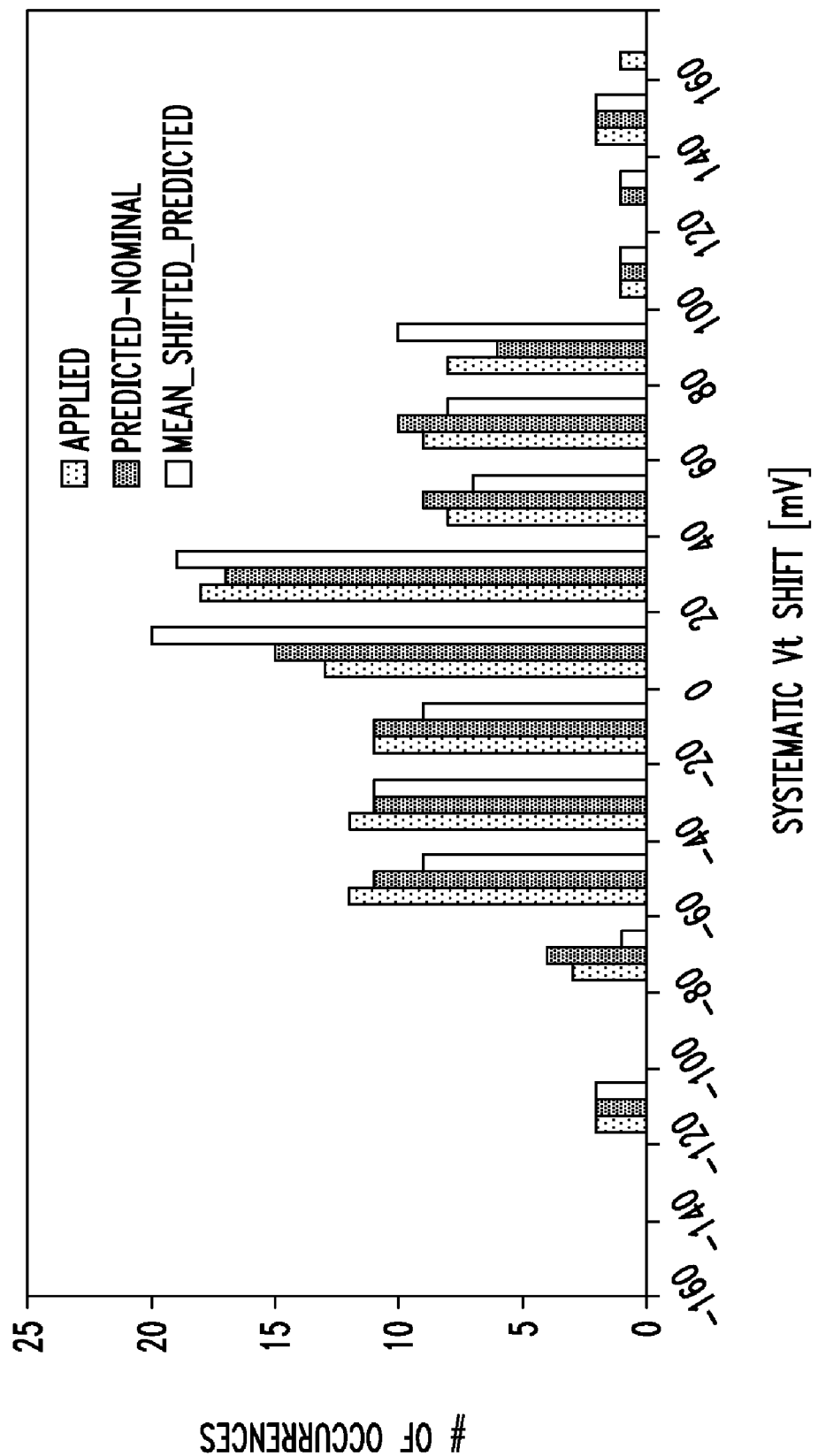
FIG. 19 shows exemplary simulation results for global systematic variability estimation using pull-up and pass-gate devices, according to another non-limiting exemplary application of inventive techniques.

One exemplary inventive implementation was validated using computer simulations. First, a known amount of Vt variation was applied to the devices. Next, using the computer simulation of an exemplary inventive test circuit and exemplary inventive characterization techniques, the Vt variability in the devices was estimated. Finally, the estimated Vt variability and the applied values were compared to determine the accuracy of the characterization scheme. FIG. 18 shows the applied and predicted Vt mismatch distribution for the pull-up and pass-gate cases (i.e. case shown in FIG. 17). It can be observed that the exemplary inventive techniques can accurately predict device mismatch. The accuracy of the scheme in predicting systematic variation was also verified using computer simulation, as shown in FIG. 19. A known global variation was applied to pull-up and pass-gate devices and inventive techniques were used for prediction. FIG. 19 demonstrates that inventive techniques can predict the systematic variation with low error. It is to be emphasized that FIGS. 18 and 19 are exemplary in nature, and different results may be obtained with other applications of the invention Comments Regarding Integrated Circuit Implementations At least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the devices or circuits described herein, and may include other devices, structures or circuits. The individual die are cut or diced from the wafer, then packaged as an integrated circuit. A person of skill in the art will know how to dice wafers and package die to produce integrated circuits. Integrated circuits so manufactured are considered part of the present invention. Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (for example, by providing a copy of the storage medium storing the design) or electronically (for example, through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

Exemplary System and Article of Manufacture Details

A variety of techniques, utilizing dedicated hardware, general purpose processors, firmware, software, or a combination of the foregoing may be employed to implement the present invention or components thereof. One or more embodiments of the invention, or elements thereof, can be implemented in the form of a computer product including a computer usable medium with computer usable program code for performing the method steps indicated. Furthermore, one or more embodiments of the invention, or elements thereof, can be implemented in the form of an apparatus including a memory and at least one processor that is coupled to the memory and operative to perform exemplary method steps.

Figure 20:
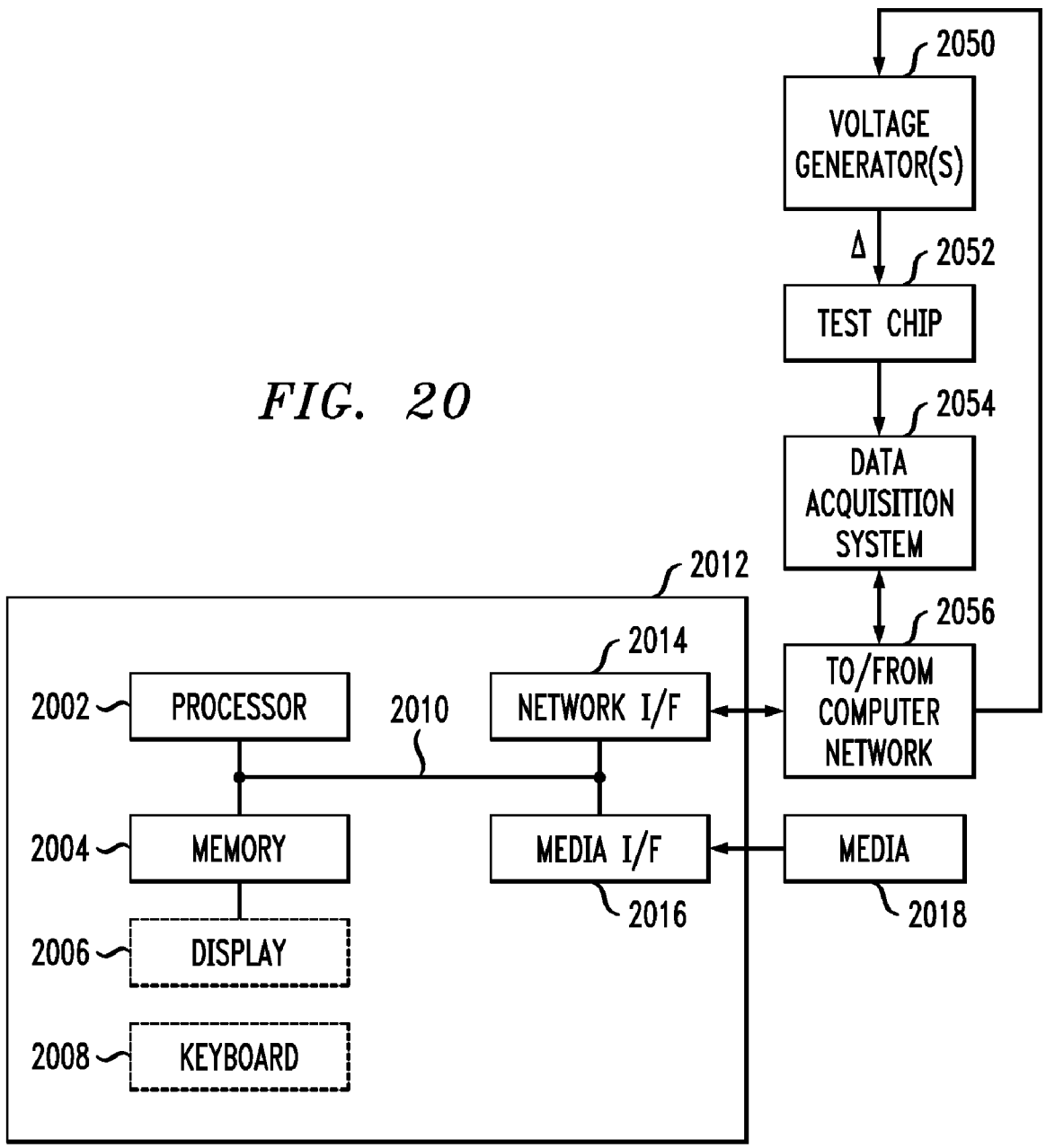
FIG. 20 depicts a computer system that may be useful in implementing one or more aspects and/or elements of the present invention.

One or more embodiments can make use of software running on a general purpose computer or workstation. For example, the selection and measurement of each cell in the array in FIG. 10 and selection of a given $\Delta$ in FIG. 10 can be controlled by software running on a computer. Further, the data acquisition and the data analysis depicted in FIG. 11 can also performed via computer software. With reference to FIG. 20, such an implementation might employ, for example, a processor 2002, a memory 2004, and an input/output interface formed, for example, by a display 2006 and a keyboard 2008. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or mole mechanisms for inputting data to the processing unit (for example, mouse), and one or more mechanisms for providing results associated with the processing unit (for example, printer). The processor 2002, memory 2004, and input/output interface such as display 2006 and keyboard 2008 can be interconnected, for example, via bus 2010 as part of a data processing unit 2012. Suitable interconnections, for example via bus 2010, can also be provided to a network interface 2014, such as a network card, which can be provided to interface with a computer network, and to a media interface 2016, such as a diskette or CD-ROM drive, which can be provided to interface with media 2018.

A chip 2052 incorporating one or more inventive aspects may interface with a data acquisition system 2054 interconnected to system 2012 via network 2056. In other embodiments, system 2012 functions as the data acquisition system. System 2012 controls voltage generator(s) 2050 over network 2056 to supply $\Delta$ and other needed voltages to chip 2052. Test results are acquired by system 2054 interfacing with system 2012 over network 2056. The depicted details are exemplary and not intended to be limiting.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and executed by a CPU. Such software could include, but is not limited to, firmware, resident software, microcode, and the like.

Furthermore, the invention can take the form of a computer program product accessible from a computer-usable or computer-readable medium (for example, media 2018) providing program code for use by or in connection with a computer or any instruction execution system. For the purposes of this description, a computer usable or computer readable medium can be any apparatus for use by or in connection with the instruction execution system, apparatus, or device. The medium can store program code to execute one or more method steps set forth herein.

The medium can be an electronic, magnetic, optical, electromagnetic, infrared, or semiconductor system (or apparatus or device) or a propagation medium. Examples of a computer-readable medium include a semiconductor or solid-state memory (for example memory 2004), magnetic tape, a removable computer diskette (for example media 2018), a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor 2002 coupled directly or indirectly to memory elements 2004 through a system bus 2010. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards 2008, displays 2006, pointing devices, and the like) can be coupled to the system either directly (such as via bus 2010) or through intervening I/O controllers (omitted for clarity).

Network adapters such as network interface 2014 may also be coupled to the system to enable the data processing system to become coupled to other data processing systems or remote printers or storage devices through intervening private or public networks. Modems, cable modem and Ethernet cards are just a few of the currently available types of network adapters.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A circuit comprising:
a comparator circuit having first and second inputs and an output, said comparator circuit being configured such that said output of said comparator circuit toggles from a first digital logical level to a second digital logical level when said first and second inputs transition between a first state wherein said first input has an applied voltage greater than an applied voltage at said second input and a second state wherein said first input has an applied voltage less than an applied voltage at said second input;
a plurality of cells, each of said cells comprising at least one series-connected pair of field effect transistors interconnected at an output node intermediate said field effect transistors, each of said transistors having a gate;

decoding logic configured to:
- select a given one of said cells for measurement; and
- selectively interconnect said output node of said given one of said cells to said first input of said comparator circuit.

2. The circuit of claim 1, further comprising voltage supply circuitry configured to apply voltages to said gates of said pair of transistors of said given one of said cells selected for measurement such that said pair of transistors operate in a linear region, and have a variable voltage difference, $\Delta$, between them, said voltage supply circuitry being further configured to vary said $\Delta$ until said comparator circuit output toggles from said first digital logical level to said second digital logical level.

3. The circuit of claim 2, wherein said comparator circuit, said plurality of cells, said decoding logic, and said voltage supply circuitry are all formed on a single integrated circuit chip.

4. The circuit of claim 3, wherein said voltage supply circuitry comprises a resistor divider.

5. The circuit of claim 3, wherein said voltage supply circuitry comprises a capacitor divider.

6. The circuit of claim 2, wherein said comparator circuit, said plurality of cells, and said decoding logic are all formed on a single integrated circuit chip, and wherein said voltage supply circuitry is formed externally to said single integrated circuit chip.

7. The circuit of claim 2, wherein said comparator circuit comprises a current latch type sense amplifier.

8. The circuit of claim 2, wherein:
- said pair of field effect transistors comprises first and second n-type metal oxide semiconductor field effect transistors, each having a drain and a source;
- said voltage supply circuitry is configured to apply:
  - a substantially constant supply voltage $V_{DD}+V_{DD}/2$ to said gate of the said first n-type transistor;
  - a substantially constant supply voltage $V_{DD}$ to said drain of said first n-type transistor; and
  - a variable voltage $V_{DD}+\Delta$ to said gate of the said second n-type transistor, said source of said second n-type transistor being grounded.

9. The circuit of claim 8, wherein:
- said cells comprise nominal static random access memory cells having pull-up and pull-down transistors;
- said first and second n-type metal oxide semiconductor field effect transistors comprise said pull-down transistors of said given one of said cells; and
- said cells are modified to eliminate conductive material between said pull-up and pull-down transistors.

10. The circuit of claim 8, wherein:
- said cells comprise nominal static random access memory cells having access transistors and inverters;
- said first and second n-type metal oxide semiconductor field effect transistors comprise said access transistors of said given one of said cells; and
- said cells are modified to eliminate cross-coupling between said inverters and to couple said access transistors into said series-connected pair of transistors.

11. The circuit of claim 8, wherein:
- said cells comprise nominal static random access memory cells having pull-up and pull-down transistors and access transistors;
- said first n-type metal oxide semiconductor field effect transistor comprises one of said pull-down transistors of said given one of said cells;
- said second n-type metal oxide semiconductor field effect transistor comprises one of said access transistors of said given one of said cells, on a same side as said first n-type metal oxide semiconductor field effect transistor; and
- said cells are modified to eliminate conductive material between said pull-up and pull-down transistors.

12. The circuit of claim 2, wherein said pair of field effect transistors comprises first and second p-type metal oxide semiconductor field effect transistors, each having a drain and a source, and wherein said voltage supply circuitry is configured to apply (i) negative $V_{DD}/2$ to said gate of said first p-type transistor, said drain of said first p-type transistor being grounded, (ii) a variable voltage $+\Delta$ to said gate of said second p-type transistor, and (iii) $V_{DD}$ to said source of said second p-type transistor.

13. The circuit of claim 12, wherein:
- said cells comprise nominal static random access memory cells having pull-up and pull-down transistors forming inverters;
- said first and second p-type metal oxide semiconductor field effect transistors comprise said pull-up transistors of said given one of said cells; and
- said cells are modified to eliminate cross-coupling between said inverters.

14. The circuit of claim 2, wherein said pair of field effect transistors comprises an n-type metal oxide semiconductor field effect transistor and a p-type metal oxide semiconductor field effect transistor and wherein said voltage supply circuitry is configured to apply a substantially zero voltage to said gate of said p-type metal oxide semiconductor field effect transistor and a variable voltage $V_{DD}+\Delta$ to said gate of said n-type metal oxide semiconductor field effect transistor.

15. The circuit of claim 14, wherein:
- said cells comprise nominal static random access memory cells having pull-up and pull-down transistors forming first and second inverters;
- said n-type metal oxide semiconductor field effect transistor comprises one of said pull-down transistors of said given one of said cells;
- said p-type metal oxide semiconductor field effect transistor comprises one of said pull-up transistors of said given one of said cells and is located on an opposite side of said cell from said n-type metal oxide semiconductor field effect transistor; and
- said cells are modified to eliminate cross-coupling between said inverters and to couple said p-type transistor and said n-type transistor into said series-connected pair of transistors.

16. The circuit of claim 14, wherein:
- said cells comprise nominal static random access memory cells having access transistors and having pull-up and pull-down transistors forming first and second inverters;
- said n-type metal oxide semiconductor field effect transistor comprises one of said access transistors of said given one of said cells;
- said p-type metal oxide semiconductor field effect transistor comprises one of said pull-up transistors of said given one of said cells and is located on a same side of said cell from said n-type metal oxide semiconductor field effect transistor; and
- said cells are modified to eliminate one cross-coupling between said inverters, said one eliminated cross-coupling being nominally interconnected to said output node.

* * * * *